United States Patent
Yamazaki et al.

(10) Patent No.: US 9,281,497 B2
(45) Date of Patent: *Mar. 8, 2016

(54) LIGHT-EMITTING DEVICE, DISPLAY DEVICE, AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Takaaki Nagata, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/507,861

(22) Filed: Oct. 7, 2014

(65) Prior Publication Data

US 2015/0021583 A1   Jan. 22, 2015

Related U.S. Application Data

(62) Division of application No. 14/227,207, filed on Mar. 27, 2014, now Pat. No. 8,871,536, which is a division of application No. 13/363,686, filed on Feb. 1, 2012, now Pat. No. 8,735,874.

(30) Foreign Application Priority Data

Feb. 14, 2011   (JP) .................. 2011-028866

(51) Int. Cl.
| | | |
|---|---|---|
| H01L 29/08 | (2006.01) | |
| H01L 51/52 | (2006.01) | |
| H01L 51/00 | (2006.01) | |
| H01L 51/56 | (2006.01) | |
| H01L 27/32 | (2006.01) | |

(52) U.S. Cl.
CPC ........ H01L 51/5246 (2013.01); H01L 51/0096 (2013.01); H01L 51/0097 (2013.01);

(Continued)

(58) Field of Classification Search
CPC . H01L 31/12; H01L 51/5278; H01L 51/5092; H01L 51/5012
USPC ........................... 257/40, 59, 72, 98
See application file for complete search history.

(56) References Cited

U.S. PATENT DOCUMENTS

| | | |
|---|---|---|
| 2,972,692 A | 2/1961 | William et al. |
| 3,833,833 A | 9/1974 | Nelson |

(Continued)

FOREIGN PATENT DOCUMENTS

| | | |
|---|---|---|
| EP | 0597226 A | 5/1994 |
| EP | 0895219 A | 2/1999 |

(Continued)

OTHER PUBLICATIONS

Tokito.S et al., "Metal Oxides as a Hole-Injecting Layer for an Organic Electroluminescent Device", J. Phys. D: Appl. Phys. (Journal of Physics D: Applied Physics), 1996, vol. 29, No. 11, pp. 2750-2753.

(Continued)

*Primary Examiner* — Tan N Tran

(74) *Attorney, Agent, or Firm* — Robinson Intellectual Property Law Office; Eric J. Robinson

(57) ABSTRACT

It is known that a light-emitting element utilizing organic EL deteriorates due to moisture. Therefore, a sealing technique to prevent moisture permeation is important. A light-emitting device including a light-emitting element utilizing organic EL is manufactured over a support substrate having flexibility and a high heat dissipation property (e.g., stainless steel or duralumin), and the light-emitting device is sealed with a stack body having moisture impermeability and a high light-transmitting property or with glass having moisture impermeability and a high light-transmitting property and having a thickness greater than or equal to 20 μm and less than or equal to 100 μm.

21 Claims, 13 Drawing Sheets

(52) U.S. Cl.
CPC .......... *H01L51/524* (2013.01); *H01L 51/5212* (2013.01); *H01L 51/56* (2013.01); *H01L 27/3204* (2013.01); *H01L 27/3246* (2013.01); *H01L 2227/326* (2013.01); *Y02E 10/549* (2013.01)

(56) References Cited

U.S. PATENT DOCUMENTS

| | | | |
|---|---|---|---|
| 4,298,869 A | 11/1981 | Okuno | |
| 5,107,175 A | 4/1992 | Hirano et al. | |
| 5,124,204 A | 6/1992 | Yamashita et al. | |
| 5,189,405 A | 2/1993 | Yamashita et al. | |
| 5,686,360 A | 11/1997 | Harvey et al. | |
| 5,693,956 A | 12/1997 | Shi et al. | |
| 5,757,126 A | 5/1998 | Harvey et al. | |
| 5,771,562 A | 6/1998 | Harvey et al. | |
| 5,811,177 A | 9/1998 | Shi et al. | |
| 5,939,839 A | 8/1999 | Robel et al. | |
| 5,952,778 A | 9/1999 | Haskal et al. | |
| 6,146,225 A | 11/2000 | Sheats et al. | |
| 6,150,187 A | 11/2000 | Zyung et al. | |
| 6,157,127 A | 12/2000 | Hosokawa et al. | |
| 6,198,217 B1 | 3/2001 | Suzuki et al. | |
| 6,198,220 B1 | 3/2001 | Jones et al. | |
| 6,268,695 B1 | 7/2001 | Affinito | |
| 6,335,713 B1 | 1/2002 | Imai | |
| 6,413,645 B1 | 7/2002 | Graff et al. | |
| 6,462,722 B1 | 10/2002 | Kimura et al. | |
| 6,522,315 B2 | 2/2003 | Ozawa et al. | |
| 6,693,296 B1 | 2/2004 | Tyan | |
| 6,717,358 B1 | 4/2004 | Liao et al. | |
| 6,747,639 B2 | 6/2004 | So | |
| 6,771,021 B2 | 8/2004 | Cok | |
| 6,839,045 B2 | 1/2005 | Ozawa et al. | |
| 6,965,195 B2 | 11/2005 | Yamazaki et al. | |
| 7,005,196 B1 | 2/2006 | Carter et al. | |
| 7,012,585 B2 | 3/2006 | Agostinelli et al. | |
| 7,068,418 B2 | 6/2006 | Kawase | |
| 7,148,632 B2 | 12/2006 | Berman et al. | |
| 7,180,093 B2 | 2/2007 | Takayama et al. | |
| 7,180,483 B2 | 2/2007 | Kimura et al. | |
| 7,199,516 B2 | 4/2007 | Seo et al. | |
| 7,221,339 B2 | 5/2007 | Ozawa et al. | |
| 7,253,793 B2 | 8/2007 | Ozawa et al. | |
| 7,255,939 B2 | 8/2007 | Carter et al. | |
| 7,271,785 B2 | 9/2007 | Jang | |
| 7,285,801 B2 | 10/2007 | Eliashevich et al. | |
| 7,322,718 B2 | 1/2008 | Setomoto et al. | |
| 7,468,580 B2 | 12/2008 | Kawase | |
| 7,541,734 B2 | 6/2009 | Yamazaki et al. | |
| 7,663,312 B2 | 2/2010 | Anandan | |
| 7,710,364 B2 | 5/2010 | Ozawa et al. | |
| 7,741,642 B2 | 6/2010 | Takayama et al. | |
| 7,755,097 B2 | 7/2010 | Kim | |
| 7,999,463 B2 | 8/2011 | Nomura | |
| 8,003,993 B2 | 8/2011 | Cho et al. | |
| 8,004,003 B2 | 8/2011 | Kim | |
| 8,735,874 B2 * | 5/2014 | Yamazaki et al. ............. 257/40 | |
| 8,871,536 B2 * | 10/2014 | Yamazaki et al. ............. 438/28 | |
| 2001/0035713 A1 | 11/2001 | Kimura | |
| 2002/0196206 A1 | 12/2002 | Kimura et al. | |
| 2003/0048072 A1 | 3/2003 | Ishihara et al. | |
| 2003/0098827 A1 | 5/2003 | Ozawa et al. | |
| 2003/0117348 A1 | 6/2003 | Knapp et al. | |
| 2003/0122805 A1 | 7/2003 | So | |
| 2003/0141807 A1 | 7/2003 | Kawase | |
| 2003/0151360 A1 | 8/2003 | Fukunaga et al. | |
| 2003/0170491 A1 | 9/2003 | Liao et al. | |
| 2003/0189401 A1 | 10/2003 | Kido et al. | |
| 2003/0227253 A1 | 12/2003 | Seo et al. | |
| 2003/0231273 A1 | 12/2003 | Kimura et al. | |
| 2004/0021425 A1 | 2/2004 | Foust et al. | |
| 2004/0031957 A1 | 2/2004 | Tyan | |
| 2004/0032220 A1 | 2/2004 | Cok et al. | |
| 2004/0150591 A1 | 8/2004 | Ozawa et al. | |
| 2004/0217702 A1 | 11/2004 | Garner et al. | |
| 2005/0077838 A1 | 4/2005 | Blumel | |
| 2005/0174064 A1 | 8/2005 | Agostinelli et al. | |
| 2005/0199599 A1 | 9/2005 | Li et al. | |
| 2005/0218791 A1 | 10/2005 | Kawase | |
| 2005/0225973 A1 | 10/2005 | Eliashevich et al. | |
| 2006/0119253 A1 | 6/2006 | Carter et al. | |
| 2006/0237735 A1 | 10/2006 | Naulin et al. | |
| 2006/0273995 A1 | 12/2006 | Ozawa et al. | |
| 2006/0273996 A1 | 12/2006 | Ozawa et al. | |
| 2006/0279491 A1 | 12/2006 | Ozawa et al. | |
| 2007/0182317 A1 | 8/2007 | Kido et al. | |
| 2007/0222372 A1 | 9/2007 | Cok et al. | |
| 2008/0001512 A1 | 1/2008 | Nomura | |
| 2008/0018231 A1 | 1/2008 | Hirakata | |
| 2008/0121918 A1 | 5/2008 | DenBaars et al. | |
| 2008/0179602 A1 | 7/2008 | Negley et al. | |
| 2008/0211416 A1 | 9/2008 | Negley et al. | |
| 2008/0213931 A1 | 9/2008 | Asabe | |
| 2008/0246704 A1 | 10/2008 | Kawase | |
| 2010/0013372 A1 | 1/2010 | Oikawa et al. | |
| 2010/0039023 A1 | 2/2010 | Rogojevic et al. | |
| 2010/0052521 A1 | 3/2010 | Kim et al. | |
| 2010/0090234 A1 | 4/2010 | Cho et al. | |
| 2010/0110551 A1 | 5/2010 | Lamansky et al. | |
| 2010/0195033 A1 | 8/2010 | Takayama et al. | |
| 2010/0295443 A1 | 11/2010 | Roberts et al. | |
| 2011/0089814 A1 | 4/2011 | Nomura | |
| 2011/0089823 A1 | 4/2011 | Nomura | |
| 2011/0101388 A1 | 5/2011 | Nomura | |
| 2011/0140617 A1 | 6/2011 | Nomura | |
| 2011/0147777 A1 | 6/2011 | Konno et al. | |
| 2012/0153333 A1 | 6/2012 | Yamazaki et al. | |
| 2012/0161165 A1 | 6/2012 | Yamazaki | |
| 2012/0161166 A1 | 6/2012 | Yamazaki | |
| 2012/0161167 A1 | 6/2012 | Yamazaki | |
| 2012/0161174 A1 | 6/2012 | Yamazaki | |

FOREIGN PATENT DOCUMENTS

| | | |
|---|---|---|
| EP | 0917127 A | 5/1999 |
| EP | 1255240 A | 11/2002 |
| EP | 1336953 A | 8/2003 |
| EP | 1337131 A | 8/2003 |
| EP | 1359789 A | 11/2003 |
| EP | 1363265 A | 11/2003 |
| EP | 1388894 A | 2/2004 |
| EP | 1619654 A | 1/2006 |
| JP | 06-208342 A | 7/1994 |
| JP | 07-065950 A | 3/1995 |
| JP | 11-273856 A | 10/1999 |
| JP | 11-307261 A | 11/1999 |
| JP | 2000-029404 A | 1/2000 |
| JP | 2002-132218 A | 5/2002 |
| JP | 2002-532848 | 10/2002 |
| JP | 2004-069774 A | 3/2004 |
| JP | 2004-234868 A | 8/2004 |
| JP | 2004-351832 A | 12/2004 |
| JP | 2005/019082 A | 1/2005 |
| JP | 2006-108651 A | 4/2005 |
| JP | 2006-049853 A | 2/2006 |
| JP | 2009-130132 A | 6/2009 |
| JP | 2010-082899 A | 4/2010 |
| JP | 2011/027811 A | 2/2011 |
| WO | WO-98/36406 | 8/1998 |
| WO | WO-00/36662 | 6/2000 |
| WO | WO-03/037040 | 5/2003 |

OTHER PUBLICATIONS

Kim.G et al., "Thin Film Passivation for Longevity of Organic Light-Emitting Devices and Organic Thin-Film Transistor", IDW'03 : Proceedings of the 10th International Display Workshops, Dec. 3, 2003, pp. 387-390.

* cited by examiner

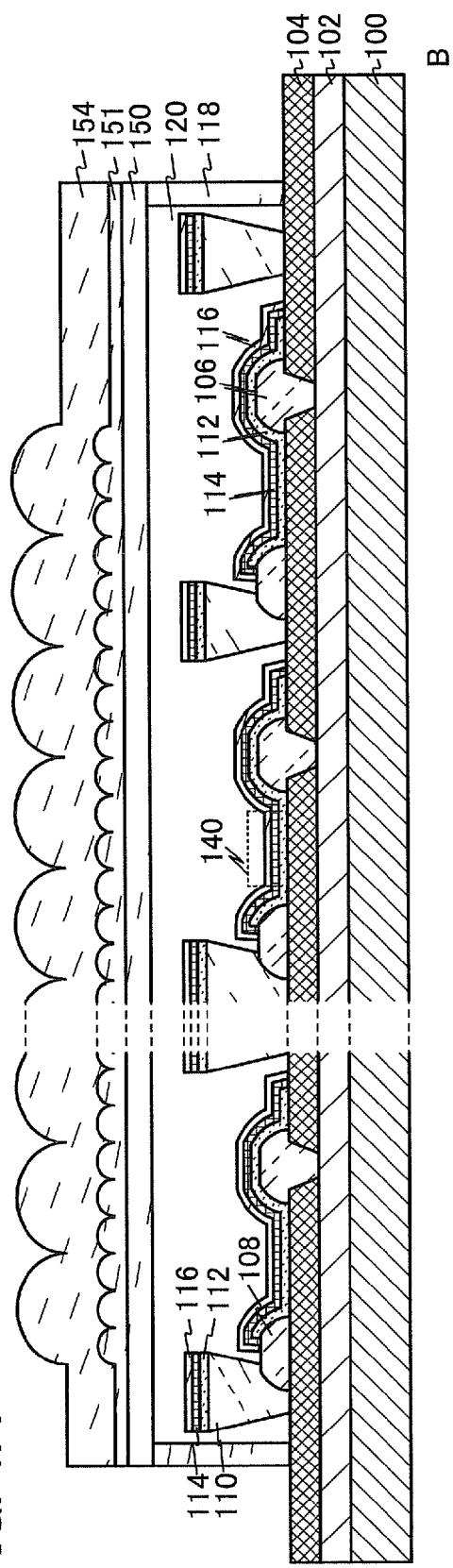
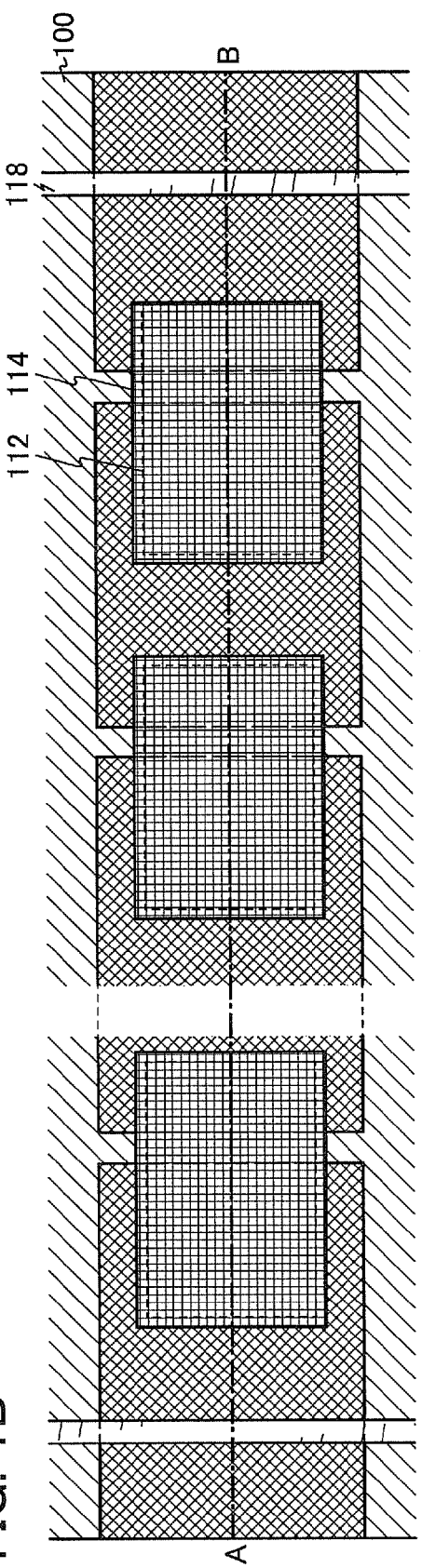

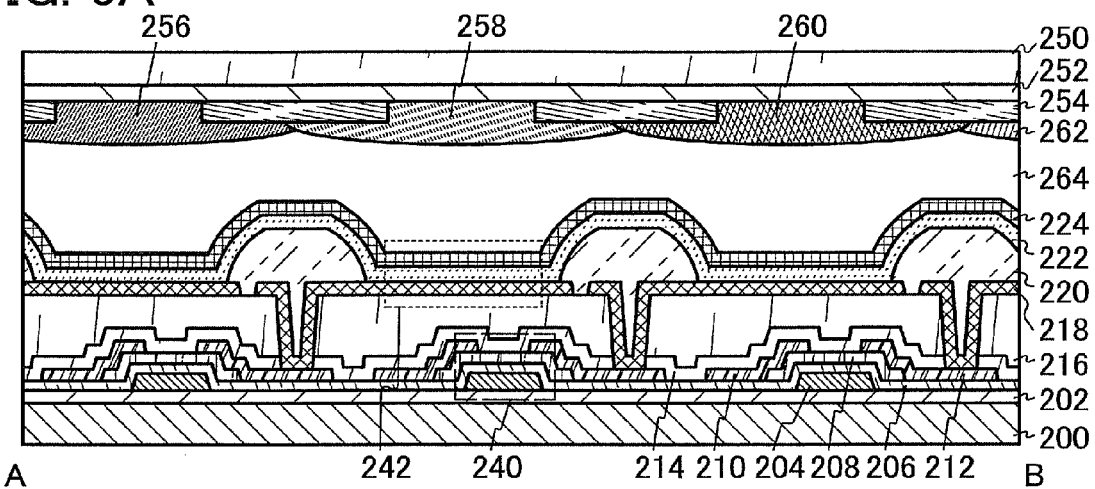
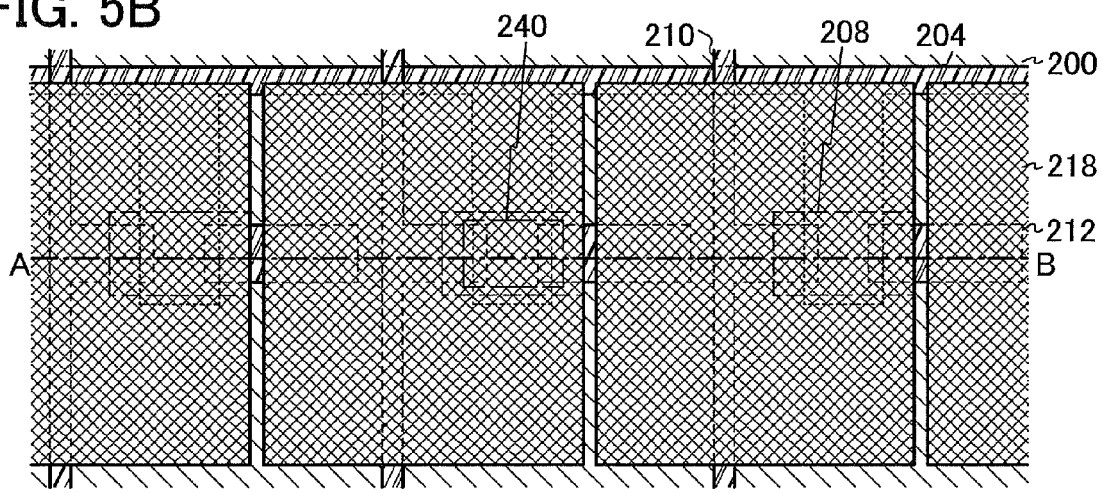
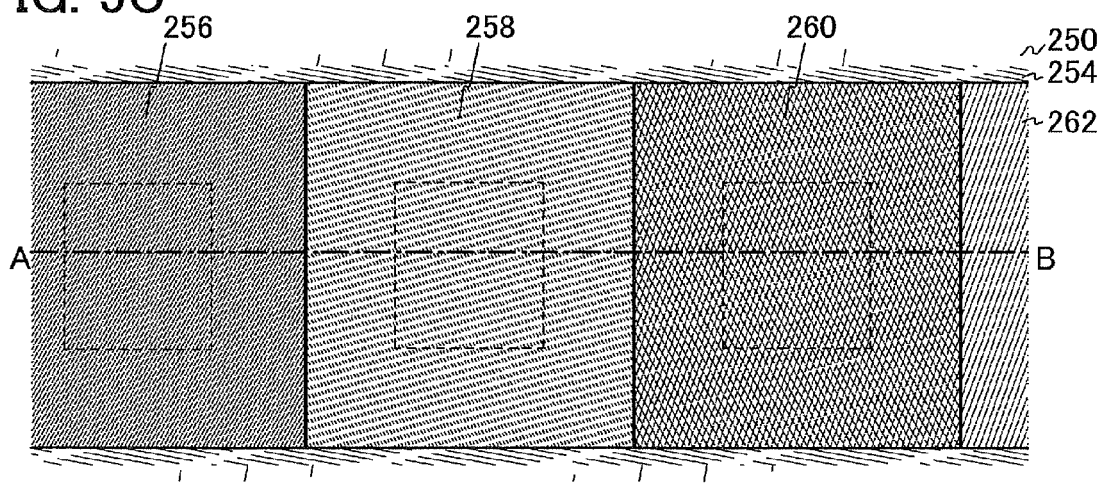

240   214 210 204 208 206 212

218
216

220

224
222

242

240  302  214 210 204 208 206 212

224
222
220
218
216

242

304
200

LIGHT-EMITTING DEVICE, DISPLAY DEVICE, AND METHOD FOR MANUFACTURING THE SAME

BACKGROUND OF THE INVENTION

1. Field of the Invention

The present invention relates to a light-emitting element utilizing organic electroluminescence (EL). The present invention relates to a light-emitting device, a lighting device, and a display device each including the light-emitting element.

2. Description of the Related Art

A light-emitting element utilizing organic EL has been actively researched and developed. A fundamental structure of the light-emitting element utilizing organic EL is a structure in which a layer containing a light-emitting organic compound is interposed between a pair of electrodes. By voltage application to this light-emitting element, light emission from the light-emitting organic compound can be obtained.

The light-emitting element utilizing organic EL can be formed in a film shape; thus, a large-area light-emitting device can be easily formed. Therefore, the light-emitting device has a high utility value as a surface light source.

For example, a lighting device to which a light-emitting element utilizing organic EL is applied is disclosed in Patent Document 1.

REFERENCE

[Patent Document 1] Japanese Published Patent Application No. 2009-130132

SUMMARY OF THE INVENTION

It is known that a light-emitting element utilizing organic EL deteriorates due to moisture. Therefore, a sealing technique to prevent moisture permeation is important.

In the case where a light-emitting element is sealed, it is necessary to use a sealing material having a light-transmitting property and moisture impermeability at least on the irradiation side of light. For example, glass can be used as the sealing material having a light-transmitting property and moisture impermeability.

However, normal glass has a low heat dissipation property; therefore, a light-emitting element utilizing organic EL deteriorates due to heat generation when light is emitted at high luminance for a long time.

In addition, glass breaks easily because of its weak strength. However, there is another problem in which the weight of a light-emitting device including a light-emitting element utilizing organic EL is increased when the thickness is increased to obtain sufficient strength.

The present invention is made in view of the foregoing technical background. Therefore, an object of the present invention is to provide a light-emitting device utilizing organic EL, which has less deterioration and less weight.

Another object of the present invention is to provide a lighting device to which the light-emitting device according to one embodiment of the present invention is applied.

Further, another object of the present invention is to provide a display device to which the light-emitting device according to one embodiment of the present invention is applied.

In the light-emitting device according to one embodiment of the present invention, a light-emitting element utilizing organic EL is formed over a support substrate having flexibility and a high heat dissipation property (e.g., stainless steel (also referred to as SUS) or duralumin), and the light-emitting element is sealed with a stack body having moisture impermeability and a high light-transmitting property or with glass having a thickness greater than or equal to 20 μm and less than or equal to 100 μm which has moisture impermeability and a high light-transmitting property.

Alternatively, the light-emitting device according to one embodiment of the present invention is a light-emitting device in which a transistor formed over a glass substrate, a quartz substrate, a silicon wafer, or the like is transferred to a support substrate having flexibility and a high heat dissipation property by a separation technique. Note that in this specification, "moisture impermeability" or "low moisture permeability" means that a water vapor permeability coefficient is lower than or equal to $1 \times 10^{-6}$ g/(m$^2 \cdot$day), preferably lower than or equal to $1 \times 10^{-7}$ g/(m$^2 \cdot$day).

Alternatively, one embodiment of the present invention provides a light-emitting device including a base insulating film over a support substrate having flexibility and a high heat dissipation property; a first electrode over the base insulating film; an organic EL layer over the first electrode; a light-transmitting second electrode over the organic EL layer; and a stack body having moisture impermeability and a high light-transmitting property which is bonded with a sealant, or glass having a thickness greater than or equal to 20 μm and less than or equal to 100 μm which has moisture impermeability and a high light-transmitting property; and a method for manufacturing the light-emitting device.

Note that the first electrode preferably has a reflectance greater than or equal to 90% in a visible light region (in the wavelength of 400 nm to 800 nm). In addition, the second electrode preferably has transmittance greater than or equal to 80% in the visible light region.

Another embodiment of the present invention is a lighting device including the light-emitting device and a method for manufacturing the lighting device.

Another embodiment of the present invention is a display device including the light-emitting device and a method for manufacturing the display device.

According to one embodiment of the present invention, a light-emitting device utilizing organic EL, which has less deterioration and less weight, can be provided.

A lighting device to which the light-emitting device according to one embodiment of the present invention is applied can be provided.

Further, a display device to which the light-emitting device according to one embodiment of the present invention is applied can be provided.

BRIEF DESCRIPTION OF THE DRAWINGS

FIGS. 1A and 1B illustrate a light-emitting device according to one embodiment of the present invention.

FIGS. 5A to 5C illustrate an example of a display device according to one embodiment of the present invention.

DETAILED DESCRIPTION OF THE INVENTION

Figure 2A:
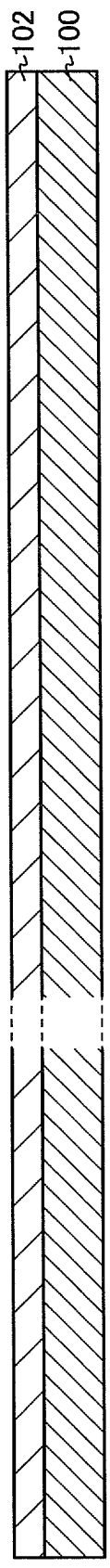
FIGS. 2A to 2D illustrate an example of a method for manufacturing a light-emitting device according to one embodiment of the present invention.

Embodiments are described in detail with reference to the accompanying drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that, in the structures of the invention described below, the same portions or portions having similar functions are denoted by the same reference numerals in different drawings, and the descriptions of such portions are not repeated.

"Depositing" refers to, for example, forming a film by an evaporation method, a sputtering method, a pulse laser deposition (PLD) method, a molecular beam epitaxy (MBE) method, a plasma chemical vapor deposition (CVD) method, a thermal CVD method, a metal organic chemical vapor deposition (MOCVD) method, an atomic layer deposition (ALD) method, an ink-jet method, or the like.

"Processing" refers to, for example, obtaining a desired shape of by etching the deposited film. For example, a resist mask may be formed by a photolithography method, and etching treatment may be performed on a region which is not covered with the resist mask. Alternatively, a photosensitive material may be processed into a desired shape by a photolithography method. Note that a laser drawing method may be employed instead of a photolithography method.

The term "forming" indicates, for example, that a film is subjected to a deposition step and a processing step. However, in an ink-jet method, a desired shape can be obtained at the same time as deposition; therefore, the term "forming" is also used in such a case.

[Embodiment 1]

In this embodiment, a light-emitting device including a light-emitting element according to one embodiment of the present invention will be described with reference to FIGS. 1A and 1B, FIGS. 2A to 2D, FIGS. 3A and 3B, and FIGS. 4A to 4D. FIG. 1A is a cross-sectional view taken along the dashed-dotted line A-B in the top view of FIG. 1B.

FIG. 1A illustrates a light-emitting device including: a first substrate 100; a base insulating film 102 over the first substrate 100; a plurality of adjacent first electrodes 104 provided over the base insulating film 102; a partition wall 106 covering end portions of the adjacent first electrodes 104; a partition wall 108 provided over each of the first electrodes 104; a partition wall 110 provided over the first electrode 104 and the partition wall 108; an organic EL layer 112 over the first electrodes 104 and the partition walls 106, 108, and 110; a second electrode 114 which covers the organic EL layer 112 and is partly in contact with the first electrode 104; and a protective insulating film 116 covering the second electrode 114. In the partition wall 110, the shape on the side in contact with the organic EL layer 112 is larger than the shape on the side in contact with the first electrode 104 when seen from the above. The light-emitting device is bonded to a second substrate 150 with a sealant 118, and a resin 151 having a structure with a lens shape is provided over the second substrate 150, and a resin 154 having a structure with a lens shape is provided over the resin 151. Note that the resins 151 and 154 may be a resin having a three-dimensional structure such as a honeycomb structure instead of the structure with a lens shape.

Note that the protective insulating film 116 is provided so that moisture or the like does not enter the organic EL layer 112; however, the protective insulating film 116 is not necessarily provided when there is sufficient sealing performance.

Note that the light-emitting device described in this embodiment is not necessary limited to the structure in which one or both of the resin 151 and the resin 154 are provided over the second substrate 150. Since the resins 151 and 154 each have the structure with a lens shape, as an advantageous effect, the rate of total reflection of light emitted from a light-emitting region 140 including the first electrode 104, the organic EL layer 112, and the second electrode 114 on a surface from which light is emitted (an interface with the air) can be reduced. However, the rate of total reflection of light on the interface between the second substrate 150 and the air can also be reduced by appropriately controlling the refractive indexes of the layers and the substrate; therefore, the resins 151 and 154 are not needed in some cases. Here, a space 120 is generated between the light-emitting device and the second substrate 150. A drying agent may be put in the space 120 in order to prevent deterioration of the organic EL layer 112. A drying agent may also be included in the sealant 118 or the like. Note that the space 120 may be filled with an organic compound or an inorganic compound having a light-transmitting property in a visible light region, such as an epoxy resin.

For the first substrate 100, a material having flexibility and a high heat dissipation property is used. For example, a metal material or a metal alloy such as aluminum, titanium, nickel, copper, silver, SUS, or duralumin may be used with a thickness greater than or equal to 20 μm and less than or equal to 700 μm, preferably greater than or equal to 50 μm and less than or equal to 300 μm. Note that duralumin is a material having low corrosion resistance; therefore, the surface of duralumin is preferably coated with a material having high corrosion resistance.

The base insulating film 102 is not particularly limited as long as a material having an insulating property is used. For example, an organic compound or an inorganic compound may be used. As an organic compound, acrylic, polyimide, epoxy, and siloxane can be given, for example. As an inorganic compound, silicon oxide, silicon oxynitride, silicon nitride oxide, silicon nitride, aluminum oxide, aluminum oxynitride, aluminum nitride oxide, and aluminum nitride can be given, for example.

Silicon oxynitride contains more oxygen than nitrogen and for example, silicon oxynitride includes oxygen, nitrogen, silicon, and hydrogen at concentrations ranging from greater than or equal to 50 atomic % and less than or equal to 70 atomic %, greater than or equal to 0.5 atomic % and less than or equal to 15 atomic %, greater than or equal to 25 atomic % and less than or equal to 35 atomic %, and greater than or equal to 0 atomic % and less than or equal to 10 atomic %, respectively. In addition, silicon nitride oxide contains more nitrogen than oxygen and for example, silicon nitride oxide includes oxygen, nitrogen, silicon, and hydrogen at concentrations ranging from greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 25 atomic %, respectively. Note that the above ranges are ranges for cases where measurement is performed using Rutherford backscattering spectrometry (RBS) or hydrogen forward scattering spectrometry (HFS). Moreover, the total of the percentages of the constituent elements does not exceed 100 atomic %.

Aluminum oxynitride contains more oxygen than nitrogen. Aluminum nitride oxide contains more nitrogen than oxygen.

For the first electrode 104, a material which efficiently reflects light emitted from the organic EL layer 112 is preferably used. Further, the first electrode 104 may have a stacked-layer structure. For example, it is preferable to use a material including lithium, aluminum, titanium, magnesium, lanthanum, silver, silicon, or nickel.

The second electrode 114 is formed using a conductive film having a light-transmitting property in a visible light region. For the conductive film having a light-transmitting property in a visible light region, for example, indium oxide containing tungsten oxide, indium zinc oxide containing tungsten oxide, indium oxide containing titanium oxide, indium tin oxide containing titanium oxide, indium tin oxide (also referred to as ITO), indium zinc oxide, and ITO to which silicon oxide is added can be given. Further, a metal thin film having a thickness enough to transmit light (preferably, approximately 5 nm to 30 nm) can also be used. For example, a silver film, a magnesium film, or a silver-magnesium (Ag—Mg) alloy film each having a thickness of 5 nm can be used as the second electrode 114.

"Having a light-transmitting property in a visible light region" means that transmittance is higher than or equal to 80% in a visible light region.

Note that one of the first electrode 104 and the second electrode 114 functions as an anode, and the other functions as a cathode. It is preferable to use a material having a high work function for the electrode which functions as an anode, and a material having a low work function for the electrode which functions as a cathode. Note that in the case where a carrier generation layer is provided in contact with the anode, a variety of conductive materials can be used for the anode regardless of their work functions.

An organic compound may be used for the partition walls 106 and 108. As an organic compound, acrylic, epoxy, polyimide, and siloxane can be given, for example.

For the partition wall 110, a material similar to that of the partition walls 106 and 108, a photosensitive resin, or the like may be used.

Figure 4A:
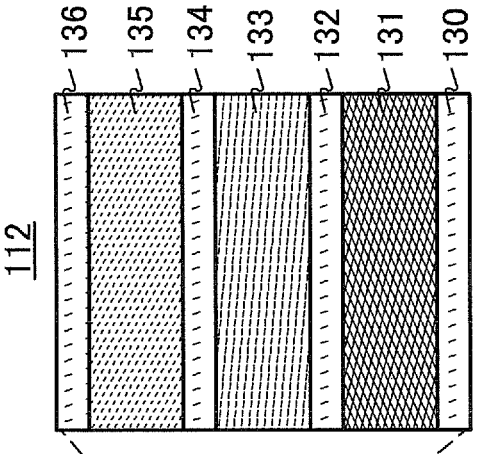
FIGS. 4A to 4D illustrate a peripheral structure of an organic EL layer and the shapes of a partition wall in a light-emitting device according to one embodiment of the present invention.
Figure 4B:
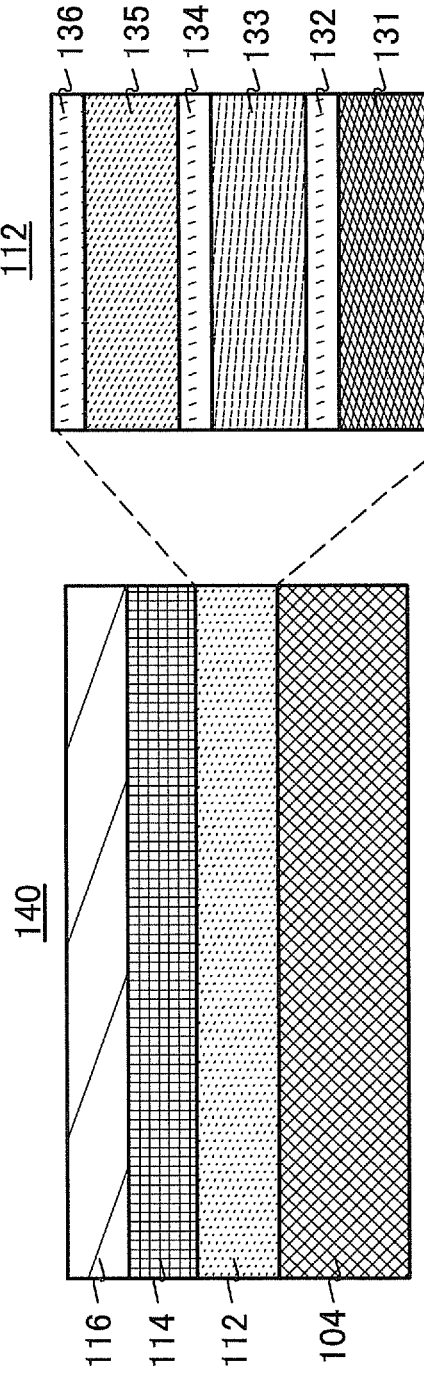
Figure 4C:
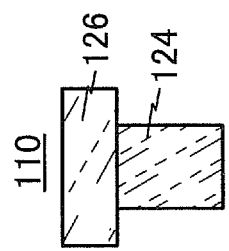
Figure 4D:
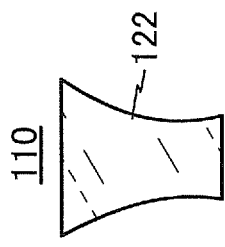

In the partition wall 110, the top surface shape on the side in contact with the organic EL layer 112 is larger than the bottom surface shape on the side in contact with the first electrode 104 when seen from the above, that is, the partition wall 110 has an overhang shape or an inverted tapered shape. In the partition wall 110, as long as the top surface shape on the side in contact with the organic EL layer 112 is larger than the bottom surface shape on the side in contact with the first electrode 104 when seen from the above, a structure including a partition wall 122 having a curved surface as illustrated in FIG. 4C or a structure in which a partition wall 124 and a partition wall 126, whose cross sections are each rectangular, are overlapped with each other as illustrated in FIG. 4D may be employed.

In the case of manufacturing a light-emitting device having a broad spectrum, plural kinds of light-emitting material or the like may be stacked as the organic EL layer 112. For example, a structure illustrated in FIGS. 4A and 4B may be employed. Here, FIG. 4A is an enlarged diagram of the light-emitting region 140 in FIG. 1A, and FIG. 4B is a diagram illustrating an example of the stacked-layer structure of the organic EL layer 112 in detail. FIG. 4B illustrates a structure in which a first intermediate layer 130, a first light-emitting layer 131, a second intermediate layer 132, a second light-emitting layer 133, a third intermediate layer 134, a third light-emitting layer 135, and a fourth intermediate layer 136 are stacked in this order. At this time, when materials having appropriate emission colors are used for the first light-emitting layer 131, the second light-emitting layer 133, and the third light-emitting layer 135, a light-emitting device with a higher color rending property or higher emission efficiency can be manufactured, which is preferable.

Although the structure in which three light-emitting layers and four intermediate layers are provided is shown here, the number of light-emitting layers and the number of intermediate layers can be changed as appropriate without limitation thereto. For example, the organic EL layer 112 can be formed with only the first intermediate layer 130, the first light-emitting layer 131, the second intermediate layer 132, the second light-emitting layer 133, and the third intermediate layer 134. Alternatively, the organic EL layer 112 can be formed with only the first intermediate layer 130, the first light-emitting layer 131, the second intermediate layer 132, the second light-emitting layer 133, the third light-emitting layer 135, and the fourth intermediate layer 136 with the third intermediate layer 134 omitted.

In addition, the intermediate layer can be formed using a stacked-layer structure of a hole-injection layer, a hole-transport layer, an electron-transport layer, an electron-injection layer, or the like. Note that not all of these layers need to be provided as the intermediate layer. Depending on the need, a layer or layers can be selected as appropriate from these layers, and each layer can be provided in duplicate or more. Further, an electron-relay layer or the like may be added as appropriate as the intermediate layer, in addition to a carrier generation layer.

As the second substrate 150, extremely thin glass having a thickness greater than or equal to 20 μm and less than or equal to 100 μm, for example, approximately 50 μm, may be used. When extremely thin glass is used as the second substrate 150, the second substrate 150 has flexibility to some extent in addition to low moisture permeability and therefore can have high resistance to bending and shock, which results in unlikeliness of breakage, for example.

Alternatively, the second substrate 150 may be a stack body having flexibility and moisture impermeability, which includes two or more materials selected from silicon oxide, silicon oxynitride, silicon nitride oxide, silicon nitride, aluminum oxide, aluminum oxynitride, aluminum nitride oxide, aluminum nitride, silicon carbide, diamond-like carbon, or a high molecular material, which is provided over a resin or a sheet having a gas barrier property.

Since the second electrode 114, the protective insulating film 116, the second substrate 150, the resin 151, and the resin 154 each have light-transmitting property in a visible light region, the light-emitting device described in this embodiment has a so-called top emission structure, in which a light emission surface is on the second substrate 150 side.

In addition, a substrate having a high heat dissipation property is used for the first substrate 100, so that heat is easily released from the light-emitting device. Therefore, reduction in reliability due to heat can be suppressed.

Next, a method for manufacturing the light-emitting device illustrated in FIG. 1A will be described.

First, the base insulating film 102 is deposited over the first substrate 100 (see FIG. 2A).

Figure 2B:
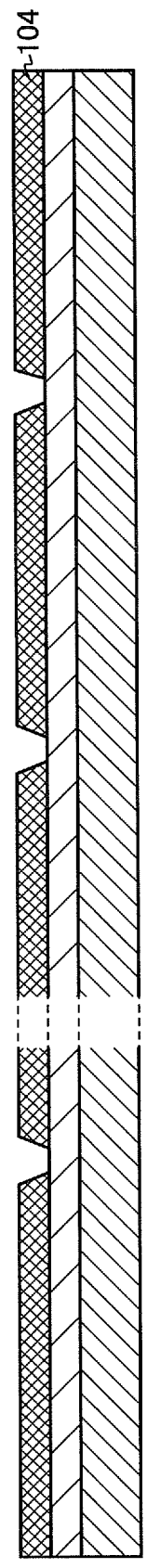
Figure 2C:
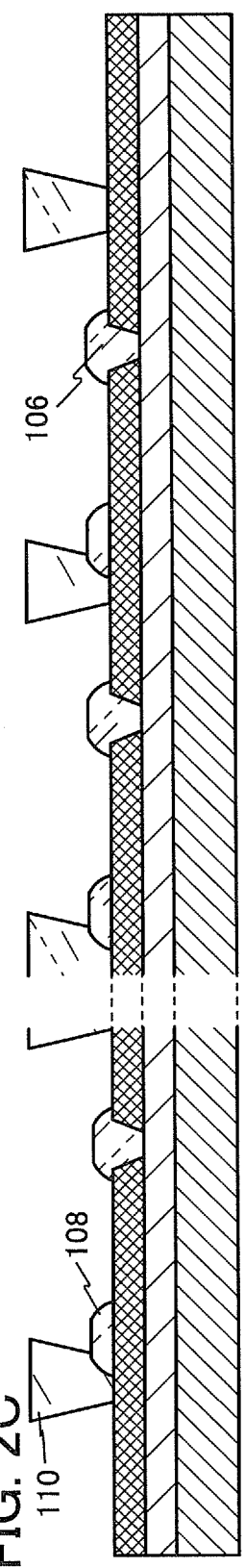

Next, a conductive film is deposited over the base insulating film 102 and processed to form the first electrodes 104 (see FIG. 2B).

Next, the partition wall 106 covering end portions of the first electrodes 104 and the partition wall 108 provided over the first electrode 104 are formed. Then, the partition wall 110 partly overlapped with the partition wall 108 are formed (see FIG. 2C). Note that the partition wall 108 is provided to prevent the first electrode 104 and the second electrode 114 from being in contact with each other in a region where the partition wall 108 is formed.

The partition wall 110 can be formed using a negative photosensitive material by a photolithography method. The partition wall 110 having a structure illustrated in FIG. 4C can also be formed in a similar manner. The partition wall 110 having a structure illustrated in FIG. 4D can be obtained in a manner such that the partition wall 124 is formed using a positive photosensitive material and then the partition wall 126 is formed using a negative photosensitive material.

Figure 2D:
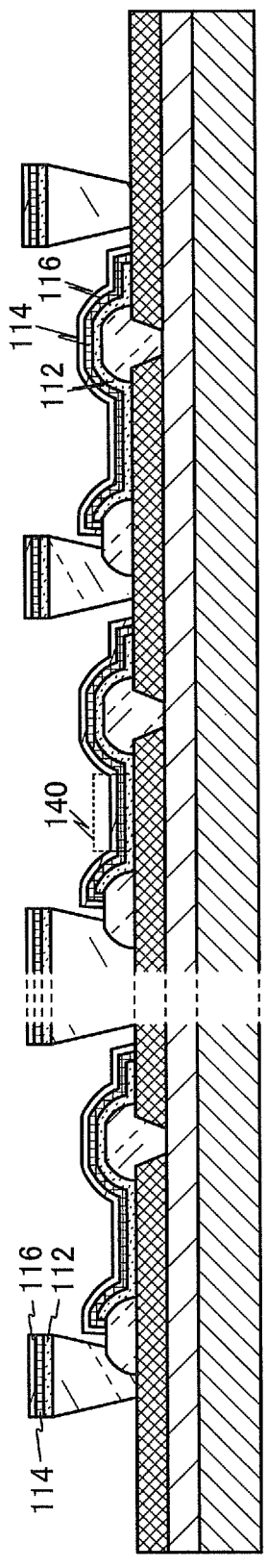

Next, the organic EL layer 112, the second electrode 114, and the protective insulating film 116 are deposited in this order over the first electrodes 104 and the partition walls 106, 108, and 110 (see FIG. 2D). Through the above steps, the light-emitting device including the light-emitting region 140 can be manufactured.

In the case where the partition wall 110 is formed in an inverted tapered shape, the organic EL layer 112, the second electrode 114, and the protective insulating film 116 can be processed into a desired shape without a metal mask. When a metal mask is used, clogging of the metal mask is likely to be caused and dust is likely to be generated as the pattern has higher definition, and the light-emitting region 140 is damaged by being overlapped with the metal mask. As a result, the quality and the reliability of the light-emitting device are degraded.

At this time, only the peripheral portion of the first substrate 100 may be covered with a mask to deposit the organic EL layer 112, the second electrode 114, and the protective insulating film 116 so that films do not attach to the peripheral portion. Note that the protective insulating film 116 is not necessarily deposited.

For example, the organic EL layer 112 is deposited by a deposition method in which an amount of entry to the shadow of an object is small (e.g., an evaporation method, a long throw sputtering method, or a collimated sputtering method). Next, the second electrode 114 is deposited by a deposition method an amount of entry to the shadow of an object is large (e.g., a MOCVD method or a sputtering method). Then, the protective insulating film 116 is deposited by a deposition method in which an amount of entry to the shadow of an object is the same as or larger than that in the case of the second electrode 114. With such methods, the first electrode 104 and the second electrode 114, which are different light-emitting regions, can be in contact with each other at one place. That is, the adjacent light-emitting regions 140 are connected to each other in series. Therefore, a light-emitting device having a high driving voltage can be obtained.

The manufactured light-emitting device is subjected to appropriate sealing because it has low resistance to moisture. Specifically, after the light-emitting device is subjected to dry treatment, the first substrate 100 and the second substrate 150 are bonded to each other with the sealant 118 (see FIG. 3A). As the dry treatment, heat treatment in a dry atmosphere is performed, for example. At this time, the space 120 is generated between the light-emitting device and the second substrate 150. The space 120 may be filled with an organic compound or an inorganic compound having a light-transmitting property in a visible light region, such as an epoxy resin. In addition, it is preferable to seal a drying agent in the space 120.

Figure 3A:
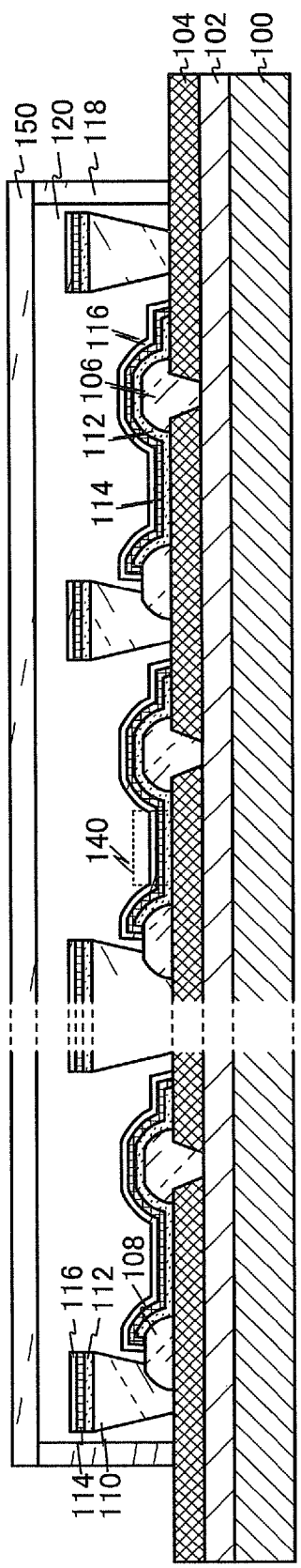
FIGS. 3A and 3B illustrate an example of a method for manufacturing a light-emitting device according to one embodiment of the present invention.
Figure 3B:
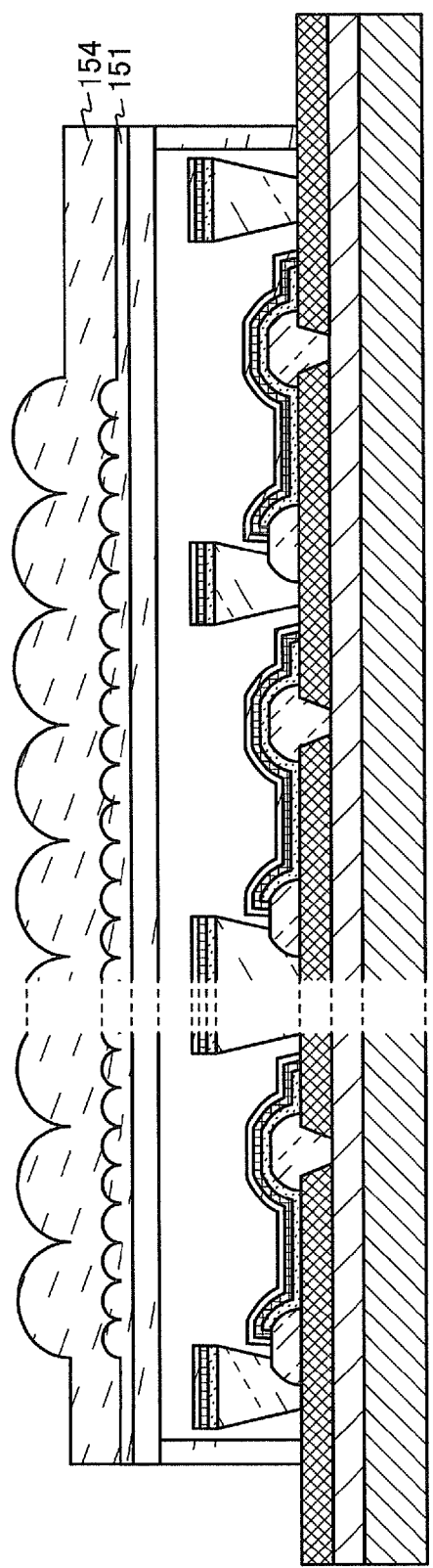

Next, the resin 151 having the structure with a lens shape and the resin 154 having the structure with a lens shape are provided over the second substrate 150 (see FIG. 3B).

Through the above steps, the light-emitting device which is sealed and provided with the resins having the structure with a lens shape can be manufactured.

Note that in the case where the above manufacturing method is applied with a non-flexible substrate instead of the first substrate 100, a light-emitting device may be separated from the non-flexible substrate by a separation method and bonded to the first substrate 100.

Since a material having flexibility and a high heat dissipation property is used for the first substrate 100 and a substrate having flexibility and moisture impermeability is used for the second substrate 150, the light-emitting device described in this embodiment has less deterioration due to moisture and heat, is lightweight, and has high resistance to bending and shock.

Further, a lighting device provided with the light-emitting device described in this embodiment, which has less deterioration and high resistance to bending and shock, can be provided.

This embodiment can be combined with any of the other embodiments as appropriate.

[Embodiment 2]

In this embodiment, a display device according to one embodiment of the present invention and a method for manufacturing the display device will be described with reference to FIGS. 5A to 5C, FIGS. 6A to 6F, FIG. 7, FIGS. 8A to 8D, FIGS. 9A and 9B, FIGS. 10A to 10D, FIGS. 11A to 11D, and FIGS. 12A to 12C.

FIG. 5A is a cross-sectional view taken along the dashed-dotted lines A-B in the top views of FIGS. 5B and 5C. Here, FIG. 5B is a top view of a first substrate 200, which is observed from a second electrode 224 side. Note that the second electrode 224, an organic EL layer 222, and the like are omitted to avoid complication. FIG. 5C is a top view of a second substrate 250, which is observed from a coloring layer 256, 258, 260, and 262 side.

A display device illustrated in FIG. 5A includes the first substrate 200; a base insulating film 202 over the first substrate 200; transistors 240 each including a drain electrode 212 over the base insulating film 202; a plurality of first electrodes 218 each in contact with the drain electrodes 212 through respective openings provided in a planarization film 216; a partition wall 220 covering end portions of the first electrodes 218; the organic EL layer 222 provided over the first electrodes 218 and the partition wall 220; the second electrode 224 provided over the organic EL layer 222; a black matrix (BM) 254 provided between the coloring layers 256 and 258, between the coloring layers 258 and 260, and between the coloring layers 260 and 262 and over the second electrode 224 with a space 264 interposed; an insulating film 252 over the BM 254 and the coloring layers 256, 258, 260, and 262; and the second substrate 250 over the insulating film 252. Note that the insulating film 252 is not necessarily provided. In addition, a protective film may be formed over the coloring layers 256, 258, 260, and 262.

Here, a protective insulating film which functions as a barrier film of the organic EL layer 222 may be provided over the second electrode 224.

Figure 7:
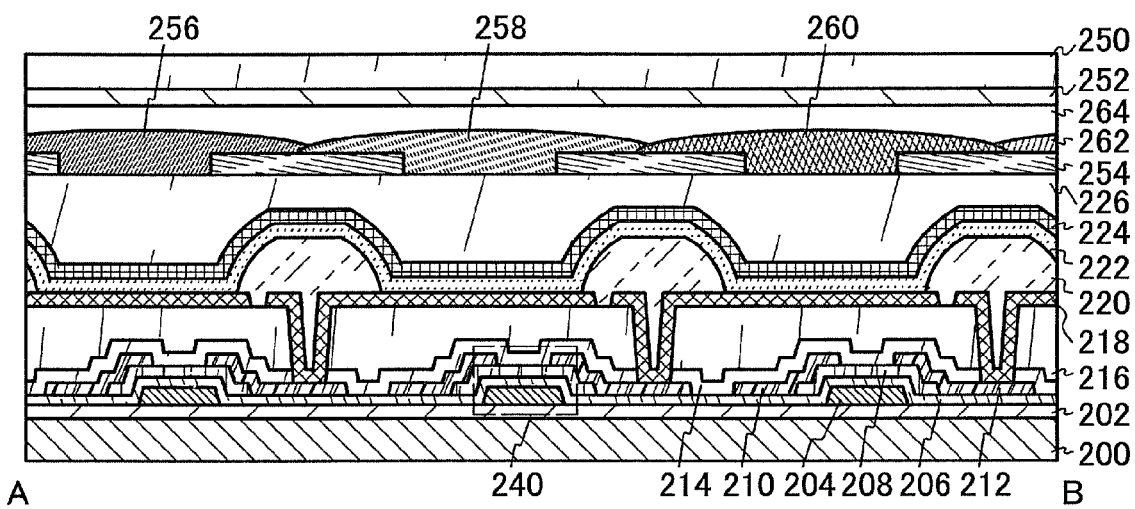
FIG. 7 illustrates an example of a display device according to one embodiment of the present invention.

Note that as illustrated in FIG. 7, a structure in which a planarization film 226 is provided over the second electrode 224; the BM 254 and the coloring layers 256, 258, 260, and 262 are provided over the planarization film 226; and the insulating film 252 and the second substrate 250 over the insulating film 252 are provided over the coloring layers 256, 258, 260, and 262 with the space 264 interposed, may also be employed.

Here, the space 264 may be filled with an organic compound or an inorganic compound having a light-transmitting property in a visible light region, such as an epoxy resin. In addition, although not illustrated, a drying agent, a spacer, or a sealant may be provided in the space 264.

In the above structure, a light-emitting region is constituted by the first electrode 218, the organic EL layer 222, and the second electrode 224.

The transistor 240 includes a gate electrode 204; a gate insulating film 206 covering the gate electrode 204; a semiconductor film 208 provided over the gate electrode 204 with the gate insulating film 206 provided therebetween; a source electrode 210 and the drain electrode 212 partly in contact with the semiconductor film 208; and a protective insulating film 214 covering at least the source electrode 210, the drain electrode 212, and the semiconductor film 208.

The structure of the transistor 240 is not limited to the above structure, and the transistor 240 can have any of various structures. Examples of the transistor 240 are illustrated in FIGS. 6A to 6F.

Figure 6A:
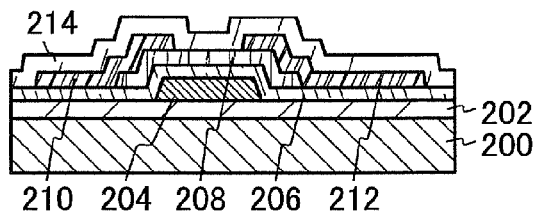
FIGS. 6A to 6F illustrate examples of transistors used in a display device according to one embodiment of the present invention.

A transistor illustrated in FIG. 6A has a structure which is the same as that of the transistor 240 illustrated in FIG. 5A.

Figure 6B:
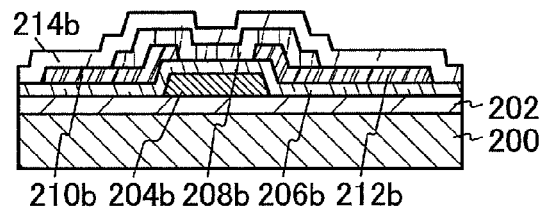

A transistor illustrated in FIG. 6B includes a gate electrode 204b over the first substrate 200 provided with the base insulating film 202; a gate insulating film 206b over the gate electrode 204b; a source electrode 210b and a drain electrode 212b over the gate insulating film 206b; a semiconductor film 208b partly in contact with the source electrode 210b and the drain electrode 212b; and a protective insulating film 214b covering at least the source electrode 210b, the drain electrode 212b, and the semiconductor film 208b.

Figure 6C:
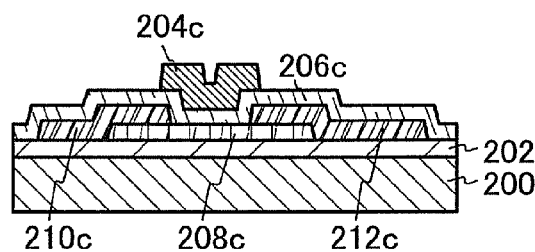

A transistor illustrated in FIG. 6C includes a semiconductor film 208c over the first substrate 200 provided with the base insulating film 202; a source electrode 210c and a drain electrode 212c partly in contact with the semiconductor film 208c; a gate insulating film 206c covering at least the source electrode 210c, the drain electrode 212c, and the semiconductor film 208c; and a gate electrode 204c provided over the semiconductor film 208c with the gate insulating film 206c provided therebetween.

Figure 6D:
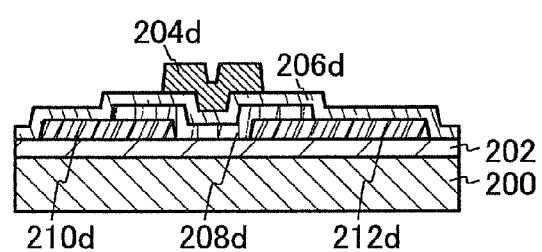

A transistor illustrated in FIG. 6D includes a source electrode 210d and a drain electrode 212d over the first substrate 200 provided with the base insulating film 202; a semiconductor film 208d partly in contact with the source electrode 210d and the drain electrode 212d; a gate insulating film 206d covering at least the source electrode 210d, the drain electrode 212d, and the semiconductor film 208d; and a gate electrode 204d provided over the semiconductor film 208d with the gate insulating film 206d provided therebetween.

Figure 6E:
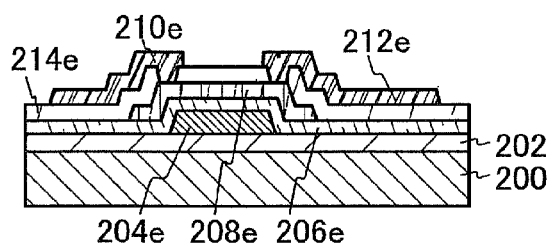

A transistor illustrated in FIG. 6E includes a gate electrode 204e over the first substrate 200 provided with the base insulating film 202; a gate insulating film 206e over the gate electrode 204e; a semiconductor film 208e over the gate insulating film 206e; a protective insulating film 214e covering the semiconductor film 208e; and a source electrode 210e and a drain electrode 212e partly in contact with the semiconductor film 208e through openings provided in the protective insulating film 214e. A source region and a drain region may be included in part of the semiconductor film 208e.

Figure 6F:
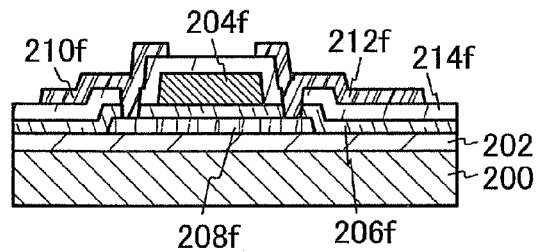

A transistor illustrated in FIG. 6F includes a semiconductor film 208f over the first substrate 200 provided with the base insulating film 202; a gate insulating film 206f over the semiconductor film 208f; a gate electrode 204f over the gate insulating film 206f; a protective insulating film 214f covering the gate electrode 204f; and a source electrode 210f and a drain electrode 212f partly in contact with the semiconductor film 208f through openings provided in the protective insulating film 214f and the gate insulating film 206f. A source region and a drain region may be included in part of the semiconductor film 208f.

Here, the semiconductor film 208 and the semiconductor films 208b to 208f may be formed using any one kind of an amorphous silicon film, a microcrystalline silicon film, a polycrystalline silicon film, a single crystal silicon film, and an oxide semiconductor film.

The oxide semiconductor film is formed using a material containing two or more kinds of elements selected from indium, gallium, zinc, tin, titanium, and aluminum.

The above-described oxide semiconductor film has a band gap of greater than or equal to 2.5 eV, preferably greater than or equal to 3.0 eV.

In the above-described oxide semiconductor film, hydrogen, an alkali metal, an alkaline earth metal, and the like are reduced and thus the concentration of impurities is extremely low. Therefore, in a transistor whose channel region is formed using the oxide semiconductor film, off-state current can be reduced.

The concentration of hydrogen contained in the oxide semiconductor film is lower than $5\times10^{18}/cm^3$, preferably lower than or equal to $1\times10^{18}/cm^3$, more preferably lower than or equal to $5\times10^{17}/cm^3$, still more preferably lower than or equal to $1\times10^{16}/cm^3$.

For the oxide semiconductor film, a four-component metal oxide such as an In—Sn—Ga—Zn—O-based material; a three-component metal oxide such as an In—Ga—Zn—O-based material, an In—Sn—Zn—O-based material, an In—Al—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; an In—O-based material; a Sn—O-based material; a Zn—O-based material; or the like may be used. In addition, any of the above materials may contain silicon oxide. Here, for example, an In—Ga—Zn—O-based material means oxide containing indium (In), gallium (Ga), and zinc (Zn), and there is no particular limitation on the composition ratio. Further, the In—Ga—Zn—O-based oxide semiconductor may contain an element other than In, Ga, and Zn. In this case, the oxide semiconductor film preferably contains the amount of oxygen is in excess of the stoichiometric proportion. When the amount of oxygen is in excess of stoichiometric proportion, carrier generation which results from oxygen vacancy in the oxide semiconductor film can be suppressed.

For example, in the case where an In—Zn—O-based material is used for the oxide semiconductor film, the atomic ratio thereof is In/Zn=0.5 to 50, preferably In/Zn=1 to 20, more preferably In/Zn=3 to 15. When the atomic ratio of Zn is in the above range, the field effect mobility of the transistor can be improved. Here, when the atomic ratio of the compound is In:Zn:O=X:Y:Z, the relation $Z>1.5X+Y$ is satisfied.

A material represented by a chemical formula, $InMO_3(ZnO)_m$ (m>0) may also be used as the oxide semiconductor film. Here, M represents one or more metal elements selected from Ga, Al, Mn, and Co. For example, M may be Ga, Ga and Al, Ga and Mn, Ga and Co, or the like.

An oxide semiconductor film can be in a single crystal state, a polycrystalline (also referred to as polycrystal) state, an amorphous state, or the like.

An oxide semiconductor film is preferably a CAAC-OS (c-axis aligned crystalline oxide semiconductor) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film cannot be found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electric characteristics of the transistor due to irradiation with visible light or ultraviolet light can be reduced. Thus, the transistor has high reliability.

As the planarization film 216, an organic compound or an inorganic compound may be used. In the case of using an organic compound, acrylic, polyimide, and siloxane can be given, for example.

The first electrodes 218, the partition wall 220, the organic EL layer 222, and the second electrode 224 can be formed using materials similar to those of the first electrodes 104, the partition wall 106, the organic EL layer 112, and the second electrode 114 described in Embodiment 1.

As the coloring layers 256, 258, 260, and 262, appropriate coloring layers are provided. For example, coloring layers of red, green, blue, and yellow; or coloring layers of red, green, blue, and white are selected. Although four kinds of coloring layers are used in this embodiment, the number of colors of coloring layers is not limited thereto. For example, the number of colors of coloring layers may be less than or equal to 3 or greater than or equal to 5.

In the display device described in this embodiment, color images can be displayed in a manner such that white light emitted from the light-emitting region 242 is radiated outside through the coloring layer 256, 258, 260, or 262. At this time, the respective thicknesses of the coloring layers may be controlled so that color images are displayed with a higher color rending property.

With such a structure in which color images are displayed by white light and coloring layers, a step of separately forming light-emitting layers which emit light of different colors is omitted, unlike the case where light-emitting regions of the respective colors are arranged to form pixels. Therefore, a display device which has higher definition and higher reliability can be manufactured.

The BM 254 is provided between the coloring layers in order to prevent color mixture between the coloring layers. The BM 254 is formed using at least one of metal materials such as titanium, tantalum, molybdenum, and tungsten; and a black resin, for example.

The insulating film 252 may be formed using a material similar to that of the base insulating film 202.

As the second substrate 250, a material similar to that of the second substrate 150 described in Embodiment 1 may be used. That is, a material which has a low moisture permeability and a light-transmitting property in a visible light region, and is unlikely to break may be used.

Since the second electrode 224, the insulating film 252, and the second substrate 250 have light-transmitting properties in a visible light region, the display device described in this embodiment has a so-called top emission structure, in which a light emission surface is on the second substrate 250 side.

In addition, a substrate having a high heat dissipation property is used for the first substrate 200 so that heat is easily released from the display device. Therefore, reduction in reliability due to heat can be suppressed.

Next, an example of a method for manufacturing the display device having the structure illustrated in FIG. 5A will be described.

Figure 8A:
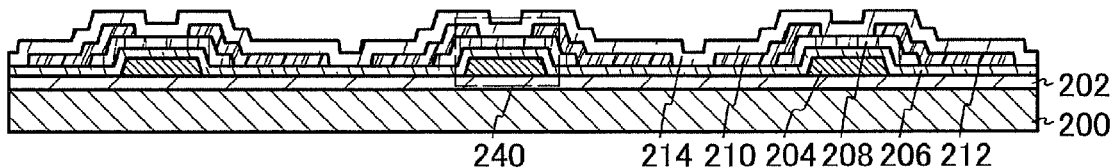
FIGS. 8A to 8D illustrate an example of a method for manufacturing a display device according to one embodiment of the present invention.
Figure 8B:
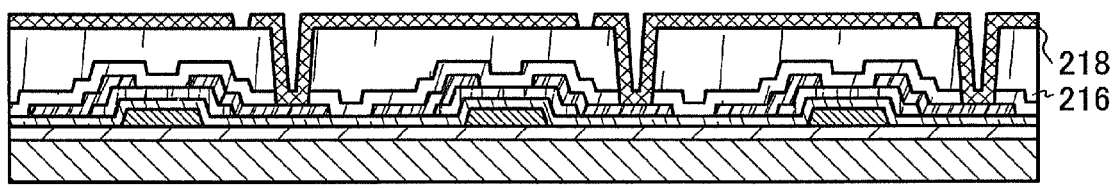

First, the transistors 240 are manufactured (see FIG. 8A).

Next, the planarization film 216 is formed over the transistors 240, and openings through which the drain electrodes 212 of the transistors 240 are exposed are formed. After that, the plurality of first electrodes 218 in contact with the drain electrodes 212 through the openings is formed (see FIG. 8B).

Figure 8C:
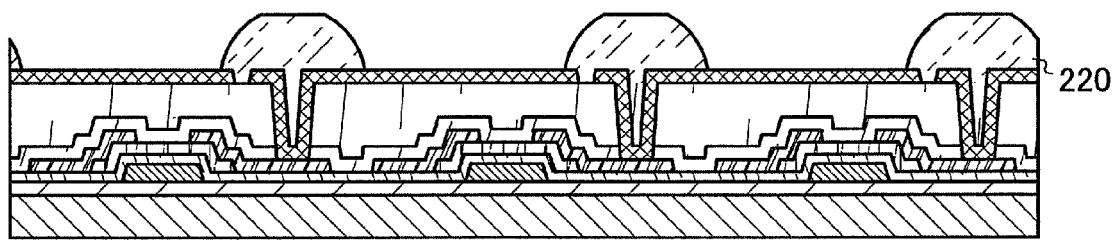
Figure 8D:
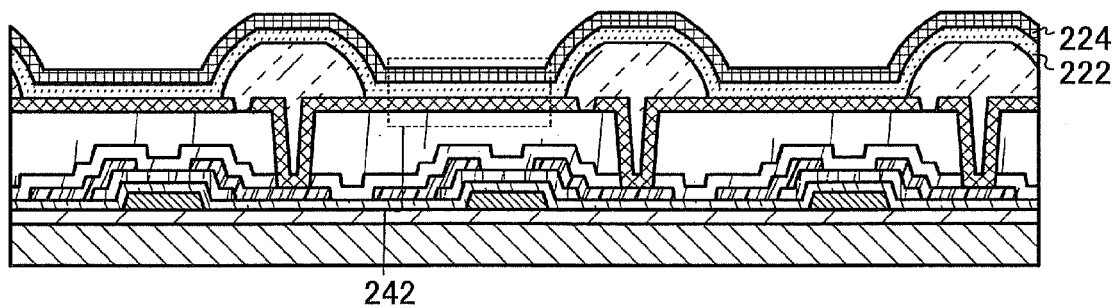

Next, the partition wall 220 that covers end portions of the first electrodes 218 (see FIG. 8C).

Next, the organic EL layer 222 is formed over the first electrodes 218 and the partition wall 220. After that, the second electrode 224 is formed over the organic EL layer 222 to form the light-emitting region 242 constituted by the first electrode 218, the organic EL layer 222, and the second electrode 224 (see FIG. 8D).

Through the above steps, the transistor 240 and the light-emitting region 242 can be formed over the first substrate 200.

Next, the second substrate 250 is prepared and the insulating film 252 is formed. After that, the BM 254 are formed (see FIG. 9A). Note that the insulating film 252 is not necessarily provided.

Figure 9A:
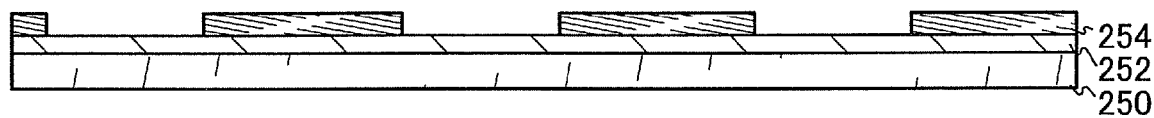
FIGS. 9A and 9B illustrate an example of a method for manufacturing a display device according to one embodiment of the present invention.
Figure 9B:
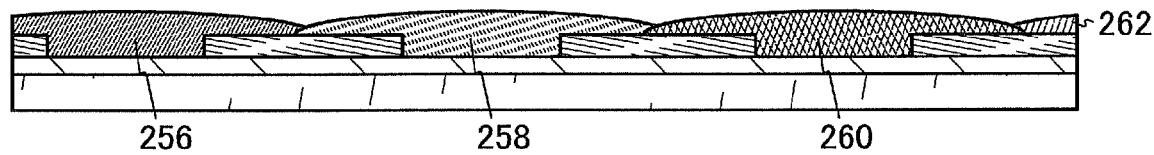

Next, the coloring layers 256, 258, 260, and 262 are formed over the insulating film 252 and the BM 254 (see FIG. 9B).

Next, a sealant is applied to an exterior frame of the first substrate 200 or the second substrate 250, and the first substrate 200 and the second substrate 250 are bonded to each other with the sealant, whereby the display device illustrated in FIG. 5A can be manufactured.

Further, when a glass substrate having a thickness greater than 100 μm is used as the second substrate 250, a side of the second substrate 250, in which the insulating film 252 and the BMs 254 are not provided in the side, may be polished so as to be extremely thin glass having a thickness greater than or equal to 20 μm and less than or equal to 100 μm.

A method for manufacturing the display device illustrated in FIG. 5A, which is different from the above manufacturing method, will be described below.

First, a separation layer 302 is deposited over a substrate 300, and the base insulating film 202 is deposited over the separation layer 302. As the substrate 300, a silicon wafer, a glass substrate, a quartz substrate, or the like may be employed. For the separation layer 302, a metal material such as tungsten, molybdenum, chromium, copper, or tantalum may be used.

The separation layer 302 is a layer which enables separation at the interface between the separation layer 302 and the base insulating film 202. The adhesion between the separation layer 302 and the base insulating film 202 needs to be strong enough for the separation with a trigger after the display device is manufactured but not strong enough for the separation during the manufacturing process of the display device.

Figure 10A:
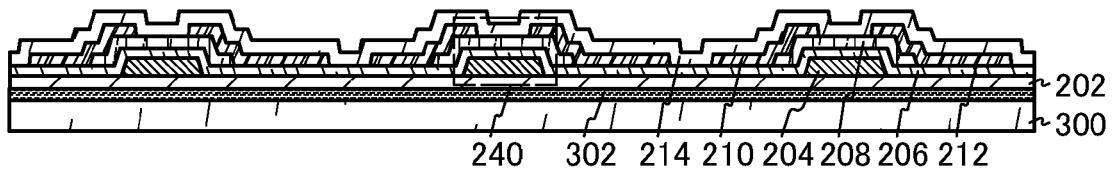
FIGS. 10A to 10D illustrate an example of a method for manufacturing a display device according to one embodiment of the present invention.

Next, the transistors 240 are manufactured over the base insulating film 202 (see FIG. 10A).

Next, the planarization film 216 having openings through which the drain electrodes 212 of the transistors 240 are exposed is formed, and the plurality of first electrodes 218 in contact with the drain electrode 212 through the openings is formed. Then, the partition wall 220 that covers end portions of the adjacent first electrodes 218 is formed. Then, the organic EL layer 222 and the second electrode 224 are stacked over the first electrodes 218 and the partition wall 220 (see FIG. 10B).

Figure 10B:
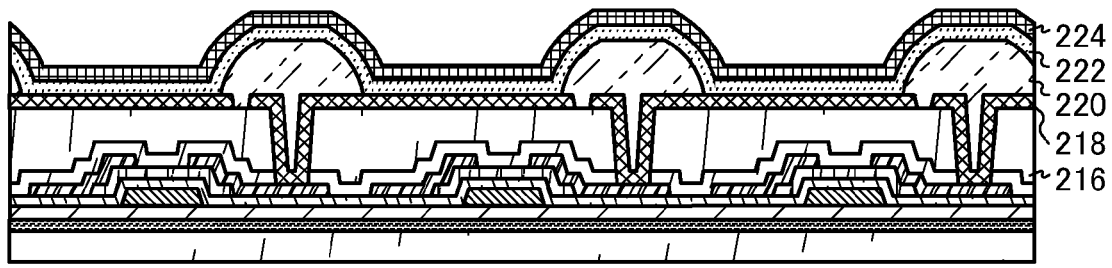
Figure 10C:
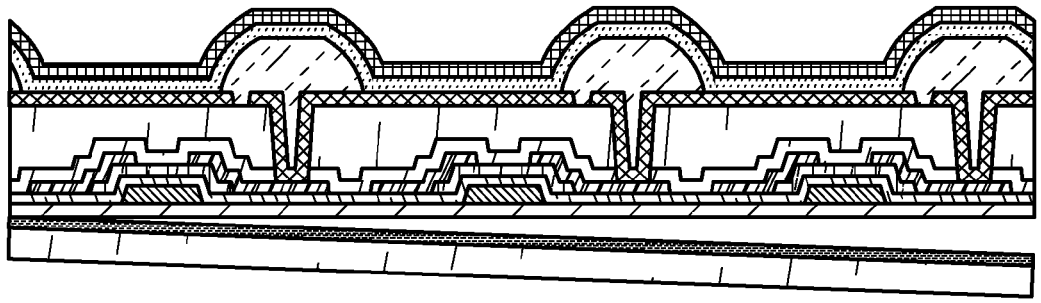

Next, the separation layer 302 and the base insulating film 202 is separated from the end portion, which is triggered by laser treatment or the like (see FIG. 10C).

Figure 10D:
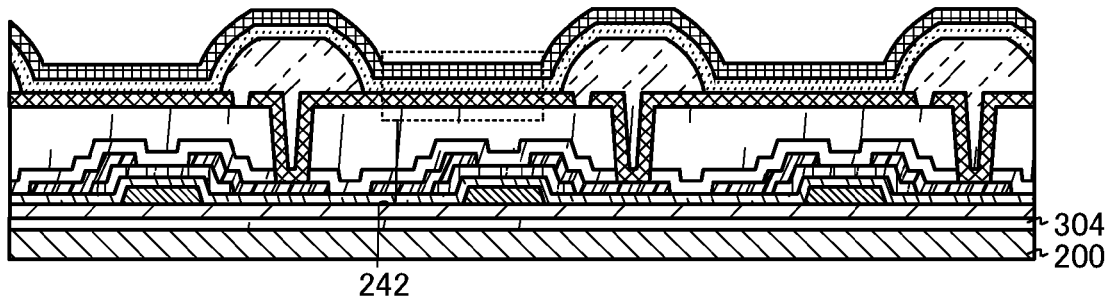

Next, the first substrate 200 is bonded to the base insulating film 202 with an adhesive 304 provided therebetween (see FIG. 10D).

Through the above steps, the transistor 240 and the light-emitting region 242 can be formed over the first substrate 200.

The second substrate 250 side can also be formed in a similar manner.

In a similar manner, a separation layer 352 is deposited over a substrate 350, and the insulating film 252 is deposited over the separation layer 352. The substrate 350 and the separation layer 352 may have structures similar to those of the substrate 300 and the separation layer 302.

Figure 11A:
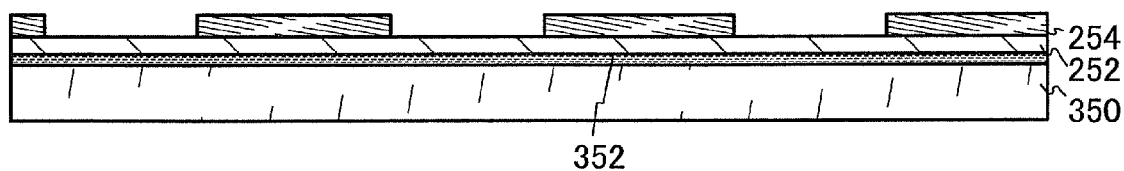
FIGS. 11A to 11D illustrate an example of a method for manufacturing a display device according to one embodiment of the present invention.

Next, the BM 254 is formed over the insulating film 252 (see FIG. 11A).

Figure 11B:
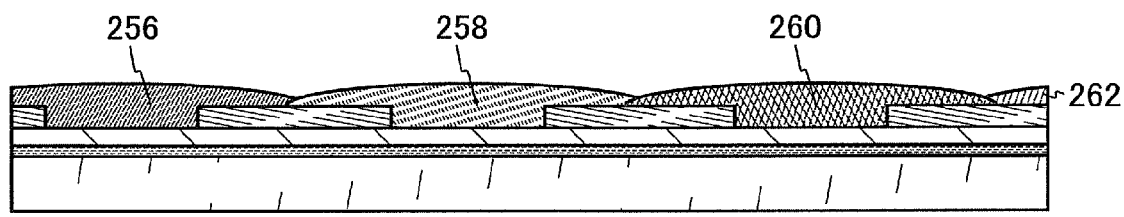

Next, the coloring layers 256, 258, 260, and 262 are formed over the insulating film 252 and the BM 254 (see FIG. 11B). Note that the coloring layers 256, 258, 260, and 262 are not necessarily formed so as to be overlapped with each other but only needs to be formed so that regions where the BM 254 is not formed is filled with the coloring layers 256, 258, 260, and 262.

Figure 11C:
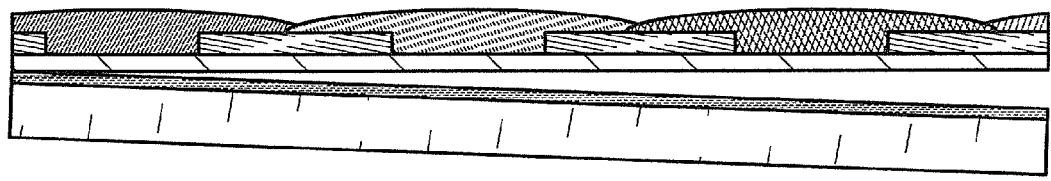

Next, the separation layer 352 and the insulating film 252 are separated from the end portion, which is triggered by laser treatment or the like (see FIG. 11C).

Figure 11D:
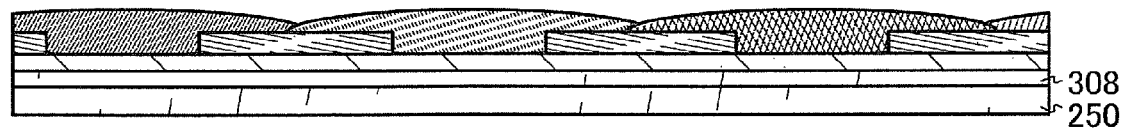

Next, the second substrate 250 is bonded to the insulating film 252 with an adhesive 308 provided therebetween (see FIG. 11D).

Through the above steps, the second substrate 250 including the BMs 254 and the coloring layers 256, 258, 260, and 262 can be manufactured.

The first substrate 200 and the second substrate 250 are bonded to each other with a sealant, whereby a display device similar to the display device illustrated in FIG. 5A can be manufactured.

Figure 12A:
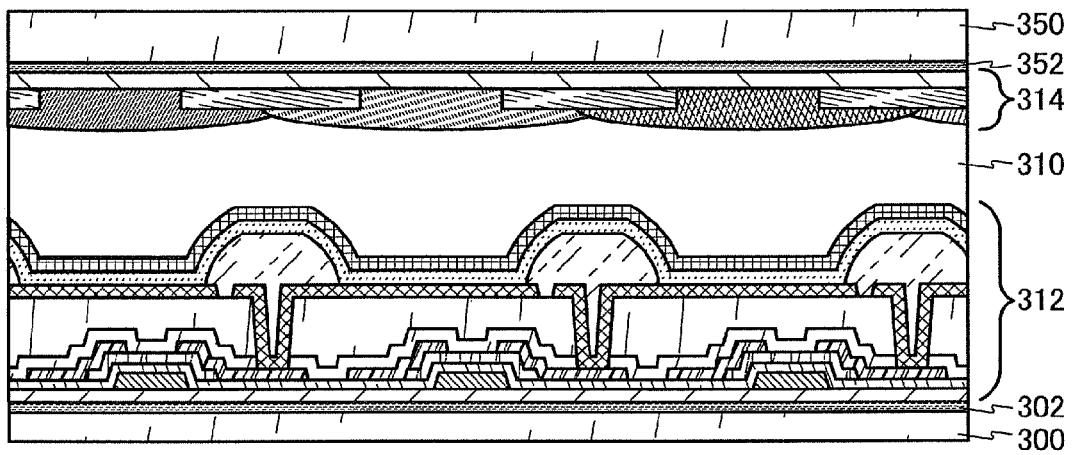
FIGS. 12A to 12C illustrate an example of a method for manufacturing a display device according to one embodiment of the present invention.
Figure 12B:
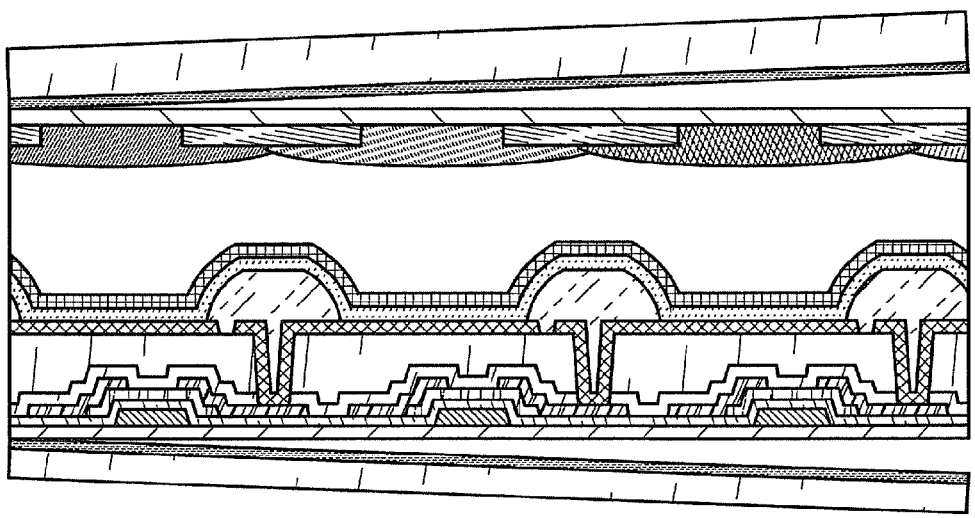
Figure 12C:
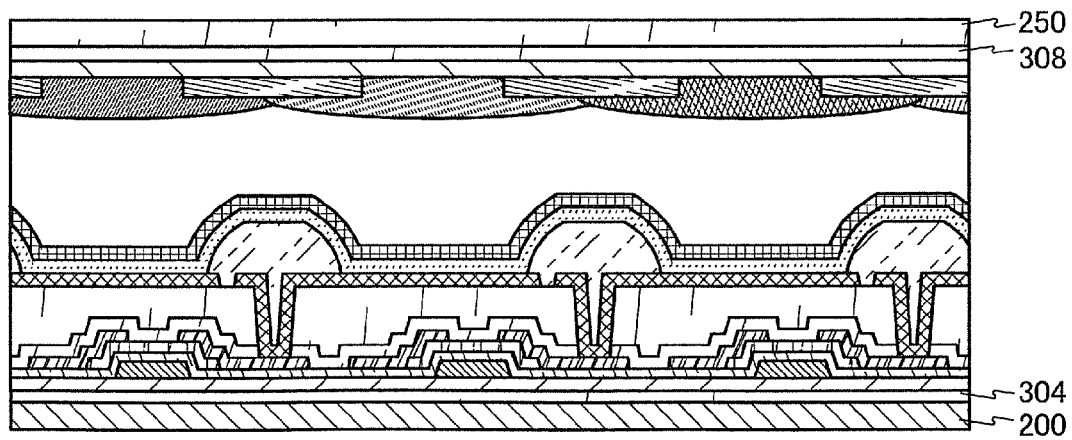

Alternatively, the display device illustrated in FIG. 5A may be manufactured in a manner such that the structure illustrated in FIG. 10B and the structure illustrated in FIG. 11B are bonded to each other with a sealant (see FIG. 12A); the light-emitting device and the substrates are separated at the interface between the substrate 300 and the separation layer 302 and the interface between the substrate 350 and the separation layer 352 (see FIG. 12B); and both surfaces of the light-emitting device are sealed with the first substrate 200 and the second substrate 250 (see FIG. 12C).

Although the step of forming the separation layers on both the first substrate 200 side and the second substrate 250 side is described in this embodiment, a separation layer may be formed only on the first substrate 200 side or only on the second substrate 250 side without limitation thereto.

Through the above steps, the display device capable of displaying color images, to which the light-emitting device utilizing organic EL is applied, can be manufactured.

Since a material having flexibility and a high heat dissipation property is used for the first substrate 200 and a substrate having flexibility and moisture impermeability is used for the second substrate 250, the display device described in this embodiment has less deterioration due to moisture and heat and has high resistance to bending and shock.

In addition, since light-emitting layers that emit light of different colors are not separately formed, a display device which has high definition and high reliability can be manufactured.

This embodiment can be combined with any of the other embodiments as appropriate.

[Embodiment 3]

In this embodiment, examples of a lighting device and a display device to which Embodiment 1 or Embodiment 2 is applied will be described.

Figure 13A:
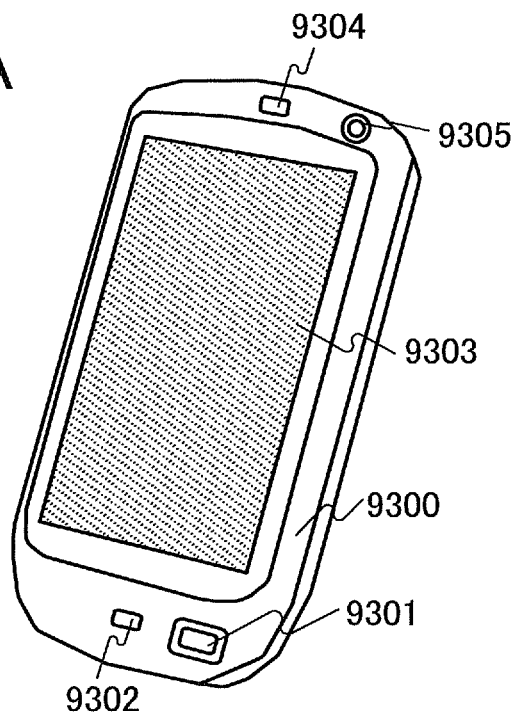
FIGS. 13A and 13B illustrate examples of an electronic device to which a light-emitting device according to one embodiment of the present invention is applied.

FIG. 13A illustrates a portable information terminal. The portable information terminal includes a housing 9300, a button 9301, a microphone 9302, a display portion 9303, a speaker 9304, and a camera 9305, and has a function as a mobile phone. The display device according to one embodiment of the present invention can be applied to the display portion 9303. By applying the display device according to one embodiment of the present invention, a portable information terminal which has high definition and high reliability can be obtained.

Figure 13B:
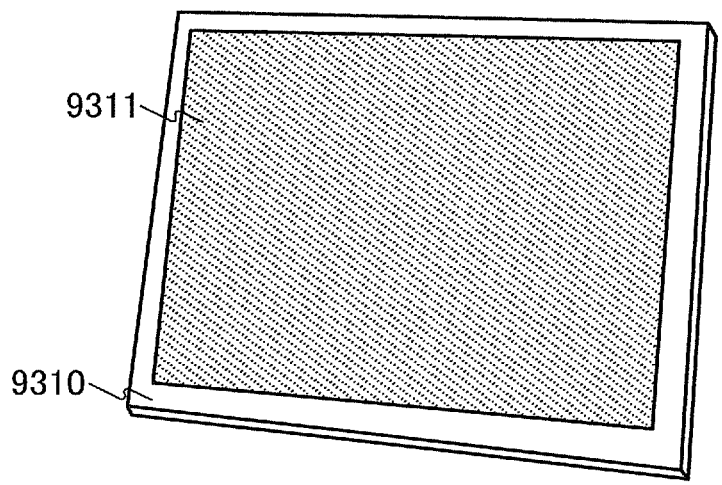

FIG. 13B illustrates a panel-type lighting device. The panel-type lighting device includes a housing 9310 and a light-emitting portion 9311. The display device according to one embodiment of the present invention can be applied to the light-emitting portion 9311. By applying the display device according to one embodiment of the present invention, a lighting device of a plane emission type, which has high resistance to bending and shock, can be obtained.

This embodiment can be combined with any of the other embodiments as appropriate.

This application is based on Japanese Patent Application Serial No. 2011-028866 filed with Japan Patent Office on Feb. 14, 2011, the entire contents of which are hereby incorporated by reference.

What is claimed is:

1. A display device comprising:
   a first substrate having flexibility;
   a base insulating film over the first substrate;
   first and second transistors over the base insulating film;
   a planarization film covering the first and the second transistors and having a first opening and a second opening;
   first and second electrodes electrically connected to an electrode of the first transistor through the first opening and an electrode of the second transistor through the second opening, respectively;
   a first partition wall covering an end portion of the first electrode and an end portion of the second electrode;
   an EL layer over the first electrode;
   a third electrode having a light-transmitting property in a visible light region over the EL layer;
   a second substrate having a vapor permeability coefficient lower than or equal to $1 \times 10^{-7}$ g/(m$^2$·day);
   a plurality of coloring layers and a black matrix between the coloring layers, wherein the plurality of coloring layers and the black matrix are provided on the second substrate; and
   a sealant,
   wherein the first substrate and the second substrate are bonded to each other with the sealant.

2. The display device according to claim 1, wherein the first substrate comprises one of stainless steel and duralumin.

3. The display device according to claim 1, wherein the second substrate is a glass substrate having a thickness greater than or equal to 20 μm and less than or equal to 100 μm.

4. The display device according to claim 1, wherein the second substrate comprises a stacked body that includes one of a sheet having a gas barrier property and a resin, and a film including two or more materials selected from silicon oxide, silicon oxynitride, silicon nitride oxide, silicon nitride, aluminum oxide, aluminum oxynitride, aluminum nitride oxide, aluminum nitride, silicon carbide, diamond-like carbon, or a high molecular material, provided over the one of the sheet having the gas barrier property and the resin.

5. The display device according to claim 1, wherein a space between the first substrate and the second substrate is filled with an organic compound having a light-transmitting property in a visible light region or an inorganic compound having a light-transmitting property in a visible light region.

6. The display device according to claim 1, further comprising a structure with a lens shape over the second substrate, the structure including a resin.

7. The display device according to claim 1, wherein the EL layer is an organic EL layer.

8. A light-emitting device comprising:
   a first substrate having flexibility;
   first and second electrodes over the first substrate having flexibility;
   a first partition wall covering an end portion of the first electrode and an end portion of the second electrode;
   an EL layer over the first electrode;
   a third electrode having a light-transmitting property in a visible light region over the EL layer;
   a second substrate having a vapor permeability coefficient lower than or equal to $1 \times 10^{-7}$ g/(m$^2$·day);
   a plurality of coloring layers and a black matrix between the coloring layers, wherein the plurality of coloring layers and the black matrix are provided between the first substrate and the second substrate; and
   a sealant,
   wherein the first substrate and the second substrate are bonded to each other with the sealant.

9. The light-emitting device according to claim 8, wherein the first substrate comprises one of stainless steel and duralumin.

10. The light-emitting device according to claim 8, wherein the second substrate is a glass substrate having a thickness greater than or equal to 20 μm and less than or equal to 100 μm.

11. The light-emitting device according to claim 8, wherein the second substrate comprises a stacked body that includes one of a sheet having a gas barrier property and a resin, and a film including two or more materials selected from silicon oxide, silicon oxynitride, silicon nitride oxide, silicon nitride, aluminum oxide, aluminum oxynitride, aluminum nitride oxide, aluminum nitride, silicon carbide, diamond-like carbon, or a high molecular material, provided over the one of the sheet having the gas barrier property and the resin.

12. The light-emitting device according to claim 8, wherein a space between the first substrate and the second substrate is filled with an organic compound having a light-transmitting property in a visible light region or an inorganic compound having a light-transmitting property in a visible light region.

13. The light-emitting device according to claim 8, further comprising a structure with a lens shape over the second substrate, the structure including a resin.

14. The light-emitting device according to claim 8, wherein the EL layer is an organic EL layer.

15. A light-emitting device comprising:
   a first substrate having flexibility;
   first and second electrodes over the first substrate having flexibility;
   a first partition wall covering an end portion of the first electrode and an end portion of the second electrode;
   an EL layer over the first electrode;
   a third electrode having a light-transmitting property in a visible light region over the EL layer;
   a second substrate having a vapor permeability coefficient lower than or equal to $1 \times 10^{-7}$ g/(m$^2$·day);
   a plurality of coloring layers and a black matrix between the coloring layers, wherein the plurality of coloring layers and the black matrix are provided between the first substrate and the second substrate; and
   a sealant,
   wherein the first substrate and the second substrate are bonded to each other with the sealant, and
   wherein the EL layer is capable of emitting white light.

16. The light-emitting device according to claim 15, wherein the first substrate comprises one of stainless steel and duralumin.

17. The light-emitting device according to claim 15, wherein the second substrate is a glass substrate having a thickness greater than or equal to 20 μm and less than or equal to 100 μm.

18. The light-emitting device according to claim 15, wherein the second substrate comprises a stacked body that includes one of a sheet having a gas barrier property and a resin, and a film including two or more materials selected from silicon oxide, silicon oxynitride, silicon nitride oxide, silicon nitride, aluminum oxide, aluminum oxynitride, aluminum nitride oxide, aluminum nitride, silicon carbide, diamond-like carbon, or a high molecular material, provided over the one of the sheet having the gas barrier property and the resin.

19. The light-emitting device according to claim 15, wherein a space between the first substrate and the second substrate is filled with an organic compound having a light-transmitting property in a visible light region or an inorganic compound having a light-transmitting property in a visible light region.

20. The light-emitting device according to claim 15, further comprising a structure with a lens shape over the second substrate, the structure including a resin.

21. The light-emitting device according to claim 15, wherein the EL layer is an organic EL layer.

* * * * *